United States Patent [19]

Ohno et al.

[11] Patent Number: 5,499,927
[45] Date of Patent: Mar. 19, 1996

[54] ZIPPER-TYPE ELECTRICAL CONNECTOR

[75] Inventors: Hirofumi Ohno; Fumio Narui, both of Tama; Shigeru Hayashi, Tokyo, all of Japan

[73] Assignees: Texell Corp.; Kel Corp., both of Tokyo, Japan

[21] Appl. No.: 248,079

[22] Filed: May 23, 1994

[30] Foreign Application Priority Data

May 21, 1993 [JP] Japan .................... 5-143062

[51] Int. Cl.⁶ .................................. H01R 13/28
[52] U.S. Cl. ................ 439/285; 29/408; 29/883; 29/884
[58] Field of Search .................... 439/285, 286, 439/284, 714; 29/408, 883, 884

[56] References Cited

U.S. PATENT DOCUMENTS

| 2,877,439 | 9/1953 | Avery | 439/285 OR |
| 3,622,936 | 11/1971 | Negishi | 439/285 OR |

FOREIGN PATENT DOCUMENTS

| 0995320 | 8/1976 | Canada | 439/285 OR |
| 59-28983 | 2/1984 | Japan . | |
| 61-12407 | 6/1986 | Japan . | |

OTHER PUBLICATIONS

IBM Technical Disclosure Bulletin vol. 13, No. 9, Feb. 1971 to Walsh.

*Primary Examiner*—Larry I. Schwartz
*Assistant Examiner*—Daniel Wittels
*Attorney, Agent, or Firm*—Robert W. J. Usher

[57] ABSTRACT

An electrical connector of the zipper type comprises first and second connector members with respective rows of contact elements and insulating elements which are brought into intermeshing relation when the connector members are closed together. The contact elements are located in a mold as stamped and formed contact strips and in-molded with a carrier of resilient insulating material, which also covers one side of each contact element in insulating relation, to provide an elongate connector member which can be handled as only a single piece.

8 Claims, 7 Drawing Sheets

ZIPPER-TYPE ELECTRICAL CONNECTOR

FIELD OF THE INVENTION

The invention relates to an electrical connector of the zipper type in which electrically connecting engagement and disengagement of rows of respective contact elements are achieved by a closing and opening zipper action.

BACKGROUND OF THE INVENTION

Electrical connectors of the zipper type are known and include first and second, elongate connector members each comprising a series of contact elements mounted spaced apart at predetermined intervals in a row on a flexible insulating support from which respective contact portions of the respective contact elements extend transversely in a common direction and at least one series of insulating elements mounted on the support of at least the first connector member in alternating relation to the contact elements so that respective contact elements and insulating elements of the first connector member can interlock in interdigitating relation with respective contact elements of the second connector member, thereby electrically to connect complementary contact faces of respective interlocked contact elements together with the insulating elements interposed therebetween. The elongate connector members are progressively closed together into the interlocking condition of electrical connection and opened apart by a zipper-like fastening implement which slides therealong.

Examples of connectors of the above type are taught by the different embodiments of Japanese Utility Model Bulletin No. 59-28983, published February, 1984 and the different embodiments of Japanese Public Patent Disclosure Bulletin No. 61-12407, published June 1986, the disclosures of which are incorporated herein by reference.

As disclosed in the above documents, in connector members of this known type, contact portions of respective contact elements of respective connector members have contact surfaces facing in different directions longitudinally of the connector member which contact surfaces are brought into engagement by closing movement of the zipper fastening implement, by insertion of the respective contact elements into gaps between contact elements and insulating elements on the other connector and firmly joined with it, so that they cannot be separated. In addition, the insulating elements are provided on both connector members and have opposed surfaces which interengage with each other while the contact portions have opposite surfaces which also engage with opposite surfaces of the insulating elements of the other connector member reinforcing the stability of connection while ensuring that the contact element with engaging contact surfaces are fully insulated from each other.

The former document teaches supporting the individual contact elements and insulating elements directly on edge portions of flexible circuit boards, while the latter document teaches that the individual contact elements and insulating elements should supported on insulating carrier strips of fabric prior to installation on a circuit board.

However, the former approach has the disadvantages of requiring that the individual contact elements and insulating elements be installed individually and separately from each other on the printed circuit boards, which is an exacting and time consuming procedure with poor operability and requiring special tooling to hold and apply the elements individually, as loose-piece items. In the latter approach, in addition to the disadvantages stated previously, as the insulating strip is flexible, the individual elements are not located in stable positions, having a tendency to shake so that their interlocking engagement can easily be broken by application of an external part, while sufficient contact pressure often cannot be obtained between the interlocked contact elements to ensure a reliable electrical connection.

SUMMARY OF THE INVENTION

An object of the invention is to obviate at least some of the above-mentioned disadvantages by providing an electrical connector of the zipper type which can be assembled or installed in a relatively simple manner and yet which provides reliable electrical connection.

According to the invention, this is achieved by forming the flexible insulating support as a resilient carrier strip in which the respective contact elements are in-molded.

This enables the contact elements to be assembled in a stable position in a very simple manner by locating them at constant pitch in a mold and pouring or injecting the molten carrier material around them. In addition, as the connector member is completely assembled prior to installation, it can be installed on the circuit board by essentially only a single operation.

Furthermore, the resiliency or elasticity of the carrier strip will provide a biassing action maintaining or returning the individual contact member in their correct positions, preventing dislodgement and disconnection by an externally applied force while also providing a desirably high contact pressure between engaging contact portions. At the same time, such elasticity or resiliency enables controlled flexure of the respective connector members in response to the complex forces produced by the opening and closing implement which ensures a smooth zipper action during connection and disconnection.

Preferably, the respective contact portions have respective contact surfaces facing in one direction longitudinally of the carrier strip and respective, oppositely facing surfaces to which at least some of the insulating elements are attached in insulating relation, advantageously, by the in-molding step.

This further assures the stability and strength of the connector as the relatively more flexible insulating elements are supported by the in-molded contact elements along their entire lengths.

More specifically, the insulating portions of one row are integrally molded in one piece with the carrier strip providing further stability.

In one example, each contact element is stamped and formed in one piece of sheet metal and comprises a tab-like body portion extending transversely from a free end of a foot of a rearward extending, L-shaped lead portion, and perpendicularly, above and below the lead portion, thereby providing a contact portion at a forward end of the body portion remote from the lead portion with a contact surface facing in one direction longitudinally of the strip and an oppositely facing surface; the resilient insulating material extending between and substantially enveloping respective body portions of respective contact elements at locations remote from the contact portions and where bent and extending along respective oppositely facing surfaces in insulating relation therewith.

As the resilient or elastic material of the carrier strip extends for substantially the entire height of the tab portions, the carrier strip retains the contact elements firmly in position.

According to another aspect of the invention, a method for manufacturing an electrical connector of a zipper type as described above comprises the steps of: providing two strips of contact elements each stamped and formed from a single piece of sheet metal stock to extend in side by side relation, spaced apart at predetermined intervals, transversely from respective integral carrier strips; supporting the respective strips of contact elements positioned in a mold with the respective contact elements of one strip alternating with the respective contact elements of another strip to form a single row of contact elements extending in side by side relation, spaced apart at predetermined, reduced intervals; injecting resilient insulating material into the mold to form a carrier strip in which respective contact elements are embedded; removing respective metal carrier strips by severing from respective contact elements, thereby to provide an elongate electrical connector member in which respective contact elements are retained by the carrier strip in the single row extending in side by side relation, spaced apart at substantially the predetermined, reduced intervals, and in a common transverse direction from the resilient carrier strip.

BRIEF DESCRIPTION OF THE DRAWINGS

Specific embodiments of electrical connector of the zipper type according to the invention will now be described by way of example only and with reference to the accompanying drawings in which.

DESCRIPTION OF PARTICULAR EMBODIMENTS

Figure 1:
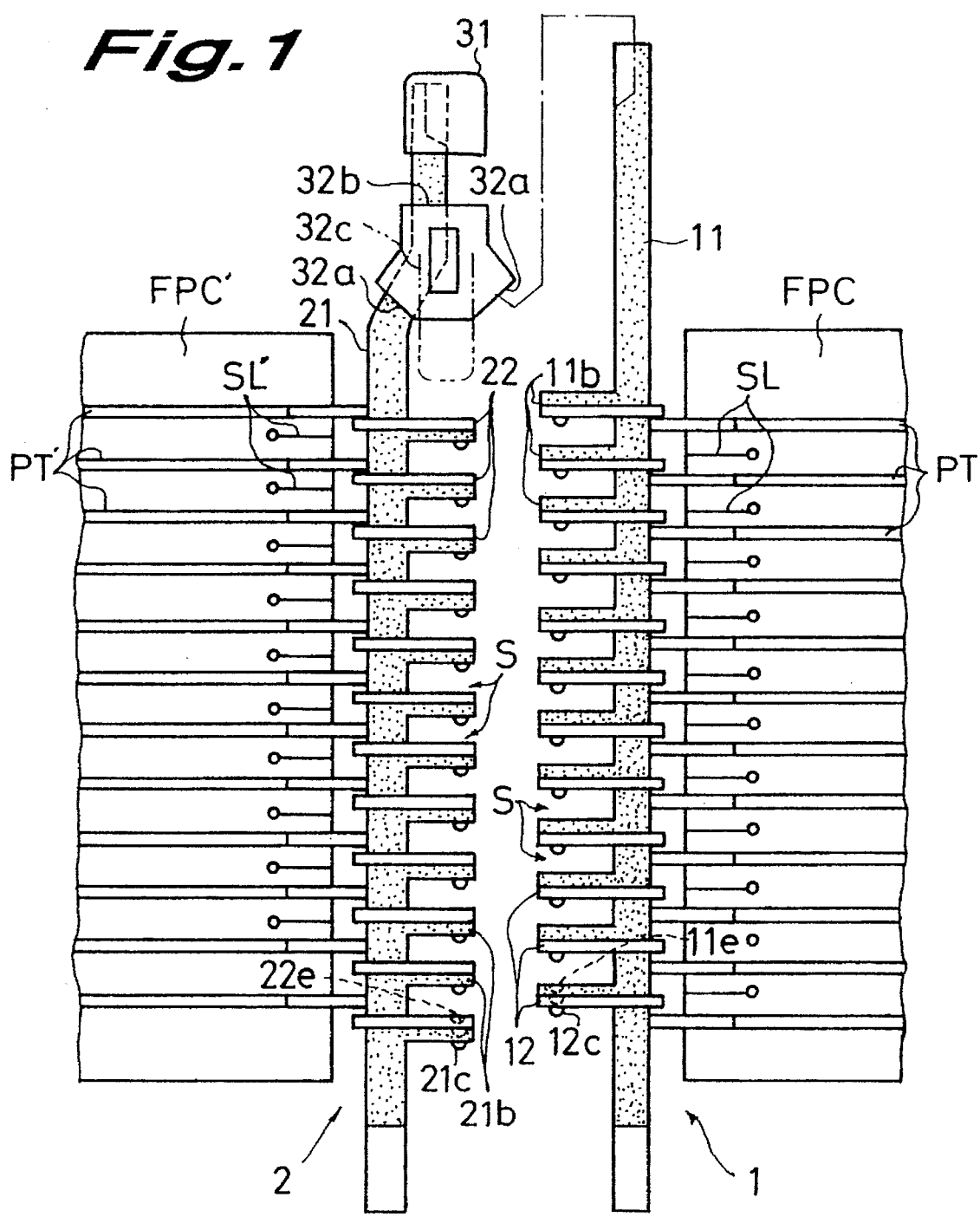
FIG. 1 is a plan view of two electrical connector members according to a first embodiment of the invention, aligned for interconnection.
Figure 2:
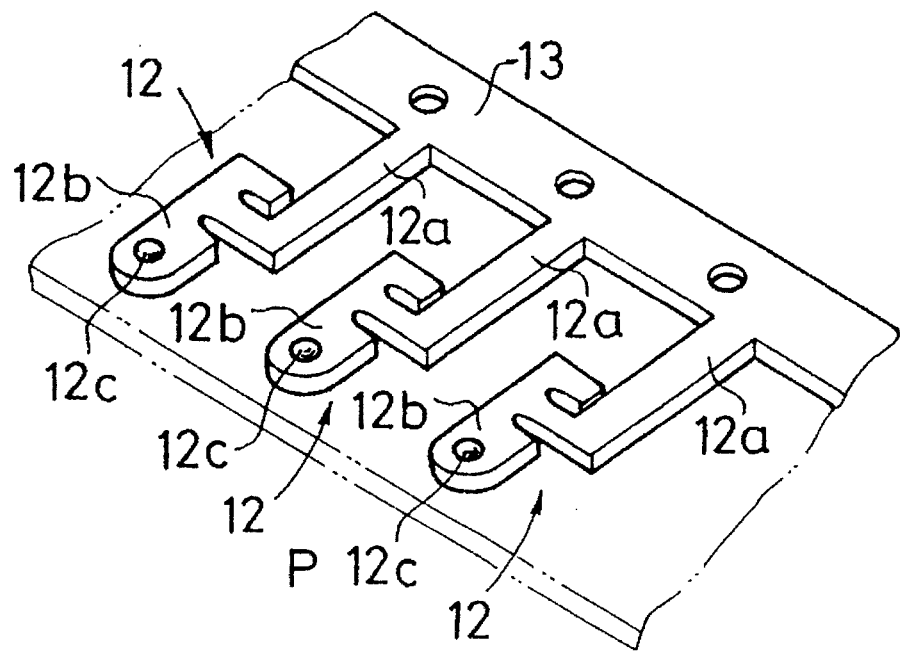
FIGS. 2A and 2B are fragmentary perspective views of a strip of contact element precursors of the first embodiment, at successive stages of forming.
Figure 2:
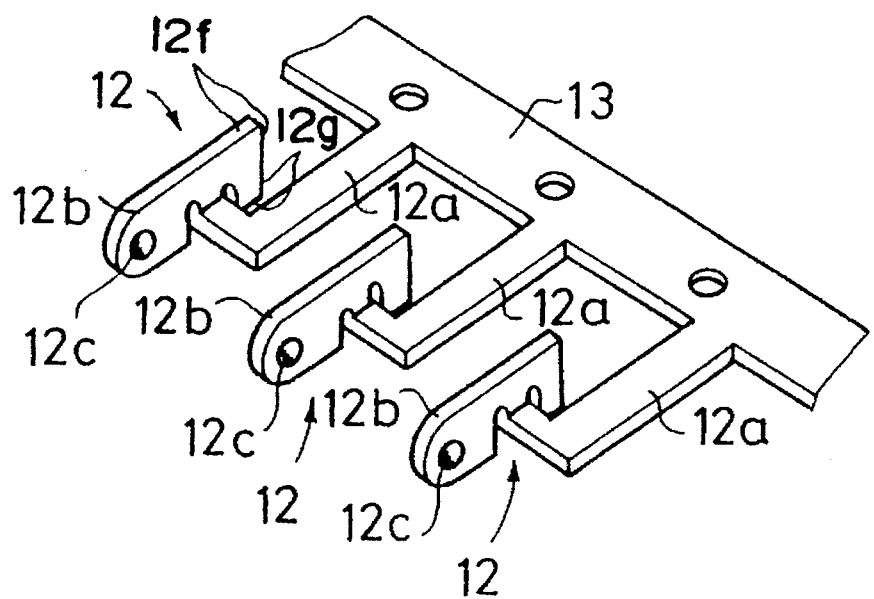
Figure 3:
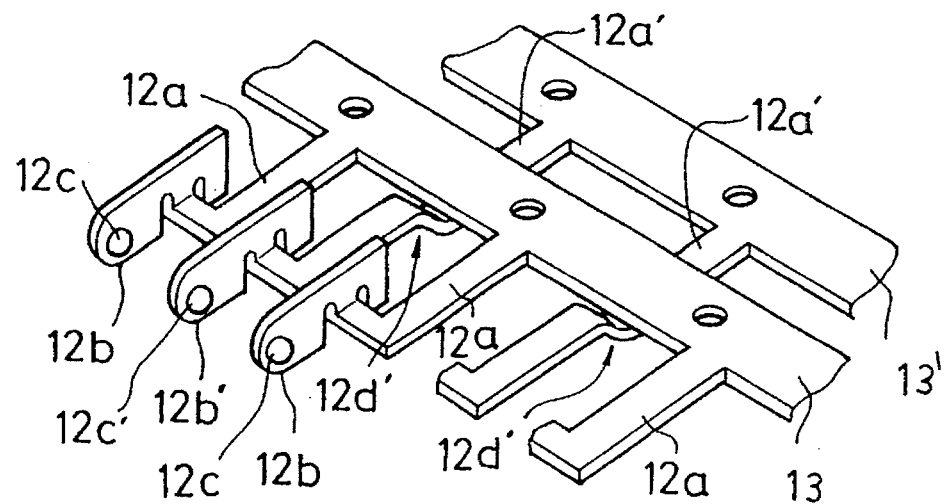
FIG. 3A is a fragmentary perspective view of two strips of contact element precursors of the first embodiment, positioned for insertion into a mold.
FIG. 3B is a schematic plan view of the two strips of contact element precursors after in-molding.
Figure 3:
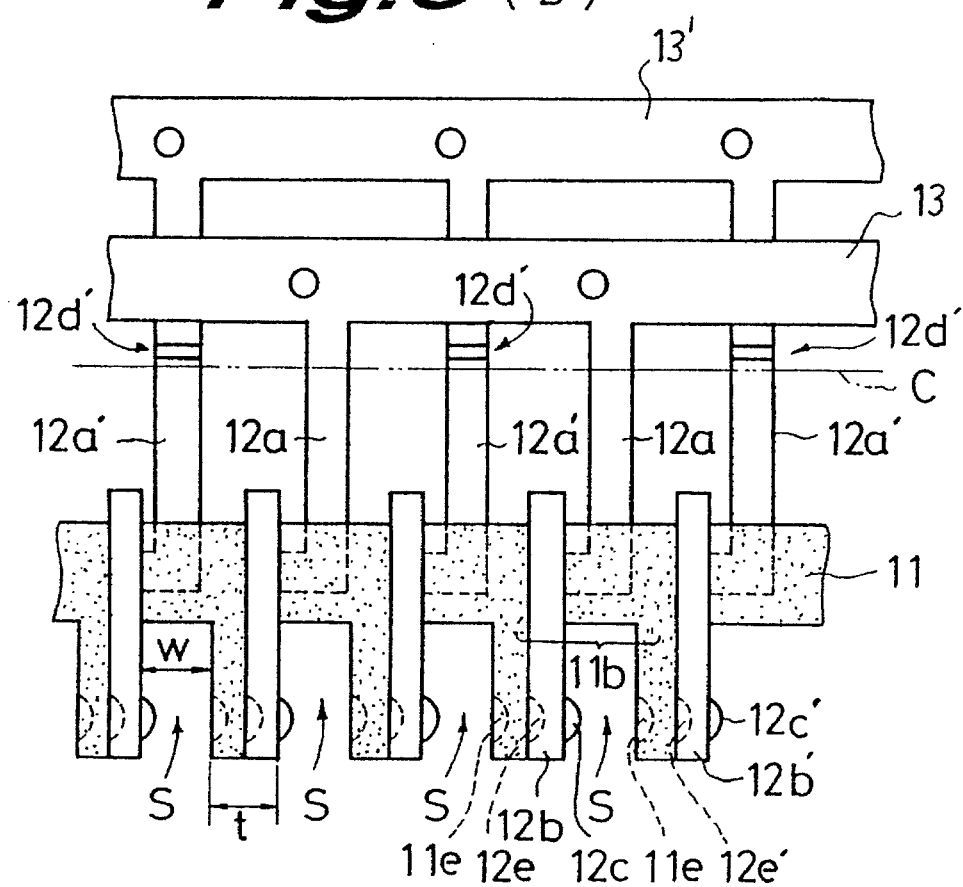
Figure 4:
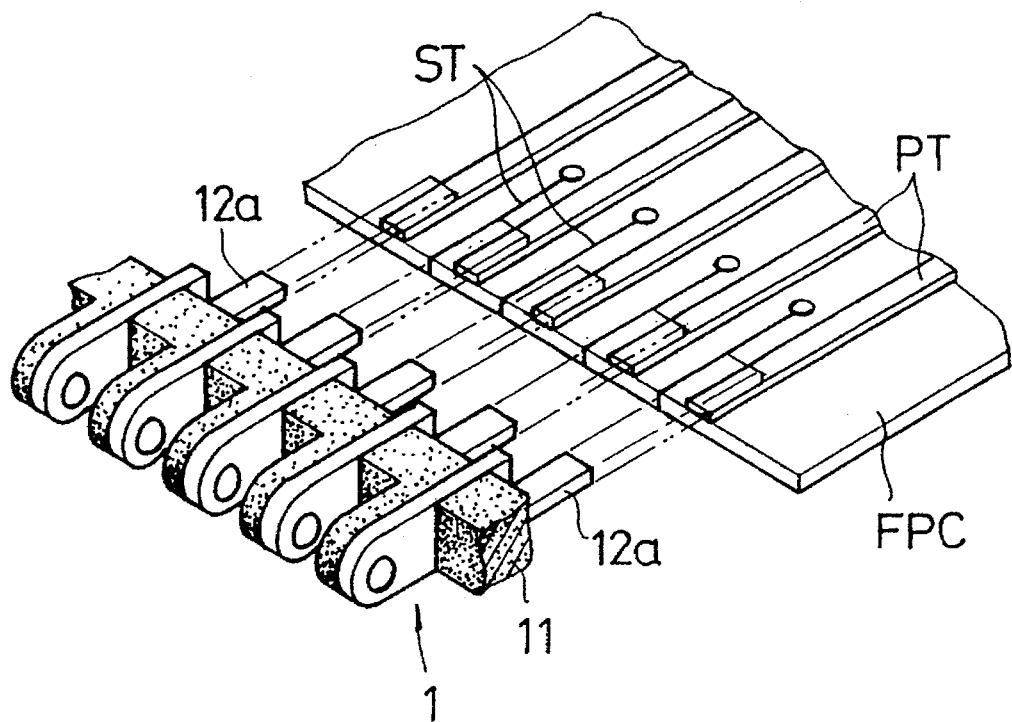
FIG. 4A is a fragmentary perspective view of a finished electrical connector member according to the first embodiment, aligned for connection to an edge portion of a flexible circuit board.
FIG. 4B is a cross-sectional view of the connector member shown in FIG. 4a, after connection to the flexible circuit board.
Figure 4:
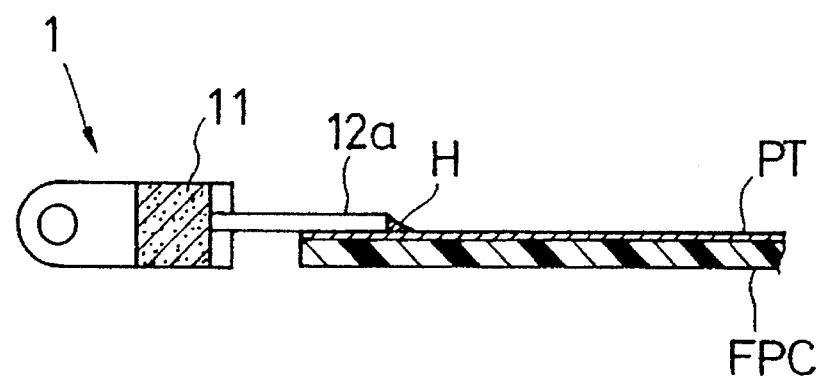

As shown in FIG. 1, an electrical connector of the zipper-type comprises first and second intermatable connector members 1 and 2, respectively, of complementary shape comprising respective insulating resilient carrier strips 11 and 21, and respective series of contact elements 12 and 22, mounted therein, spaced apart at predetermined intervals in respective rows with respective contact portions extending transversely, in opposite common directions from respective carrier strips.

Figure 6:
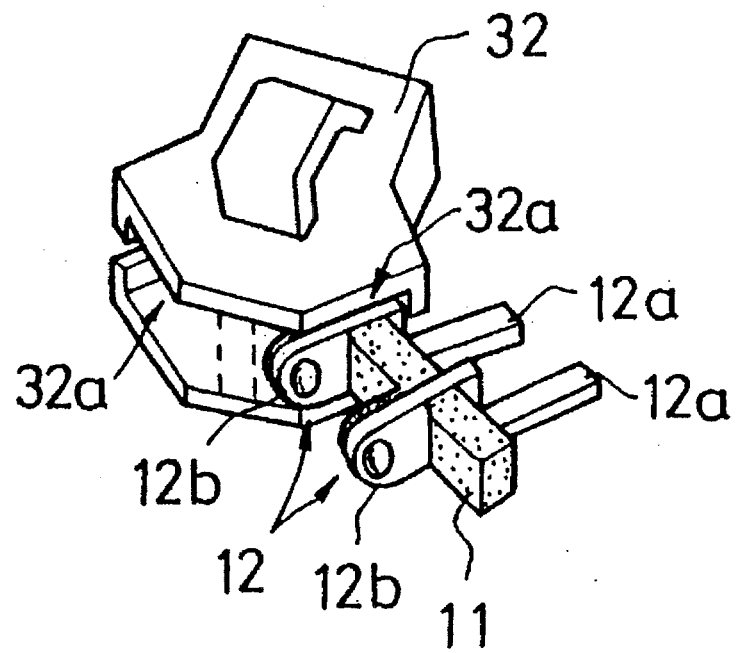
FIG. 6A is a perspective view of the opening and closing implement illustrating the operation thereof.
FIG. 6B is a fragmentary cross-sectional view of the implement of FIG. 6A.
Figure 6:
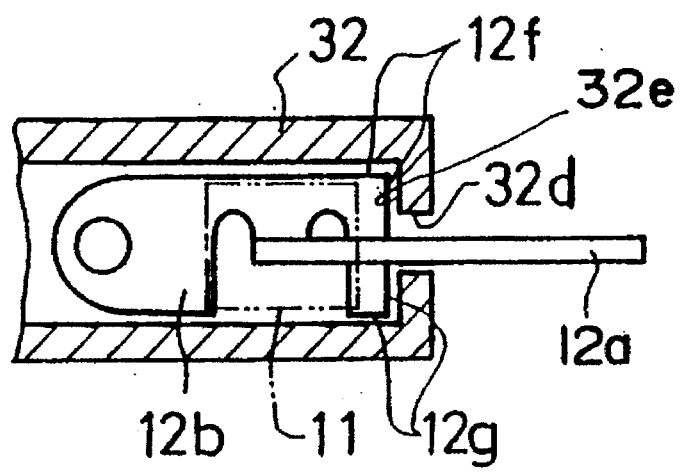

Each contact element 12 and 22 is one piece of sheet metal and comprises a rectangular, tab-like body portion 12b extending transversely from a free end of a foot of a rearward extending, L-shaped lead portion 12a and bent to extend perpendicularly, above and below the lead portion, defining upper and lower rear shoulders 12f and 12g, respectively, shown in FIG. 6, and providing a contact portion at a forward end of the body portion remote from the lead portion with a contact surface formed with a contact pimple or convex protuberance 12c facing in one direction longitudinally of the strip and an oppositely facing surface formed with a complementary concavity or dimple 12e.

The carrier strips 11 and 21, respectively, comprise respective band portions of substantially rectangular cross-section extending between, and substantially enveloping respective body portions of respective contact elements 12 and 22, at locations remote from the contact portions and where bent, and shoulder-like insulating elements 11b and 21b, respectively, integrally formed with respective band portions of the respective carrier strips 11 and 21, and extending transversely therefrom attached to respective oppositely facing surfaces of the tab-like body portions of respective contact elements in covering, insulating relation so that the insulating elements in effect alternate with the contact elements. Exposed surfaces of respective insulating elements are formed with indents aligned longitudinally with the dimples and pimples 12e and 12c.

Figure 5:
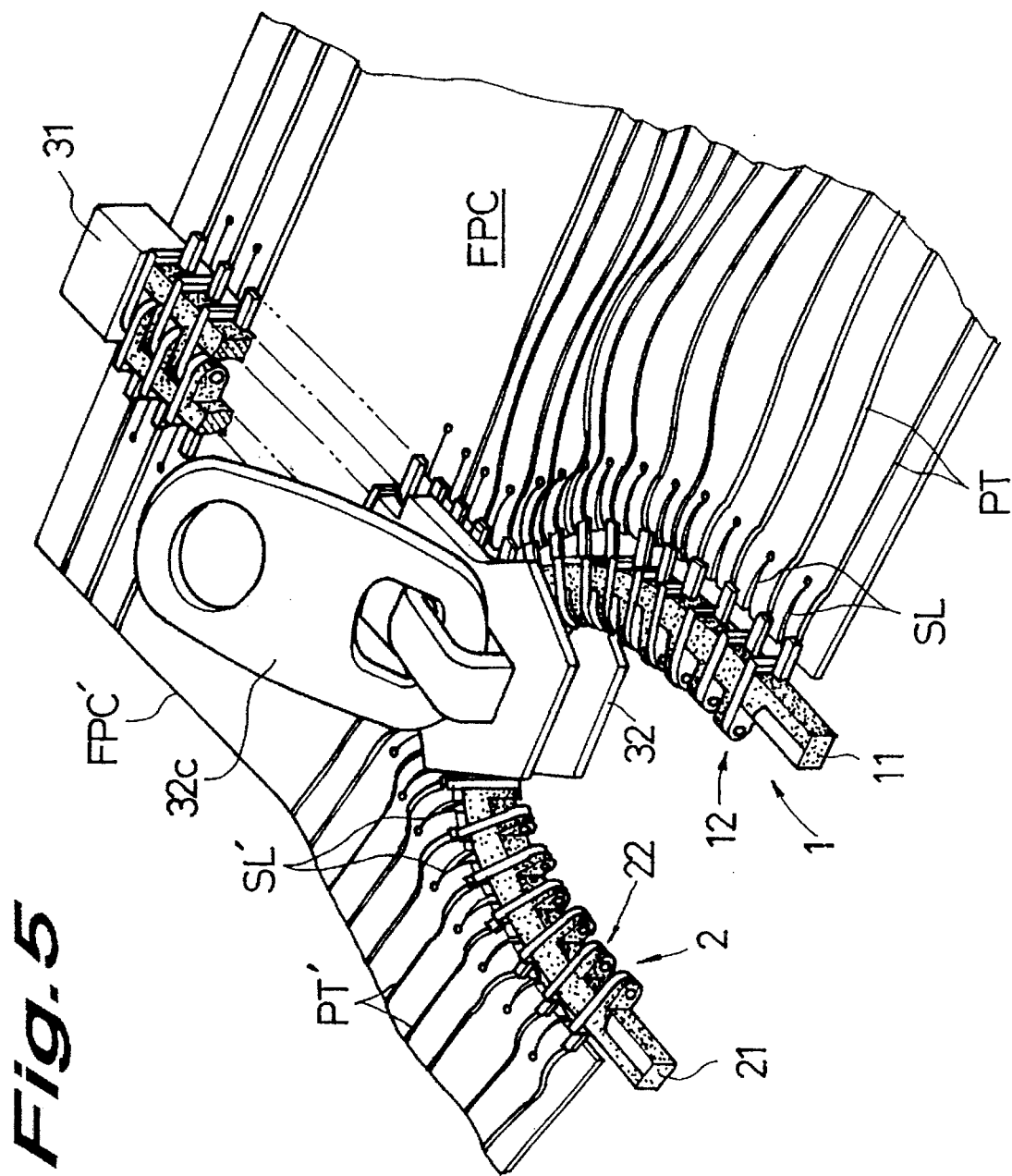
FIG. 5 is a perspective view of the completed electrical connector according to the first embodiment, mounted on respective edge portions of respective flexible circuit boards during connection thereof.
Figure 7:
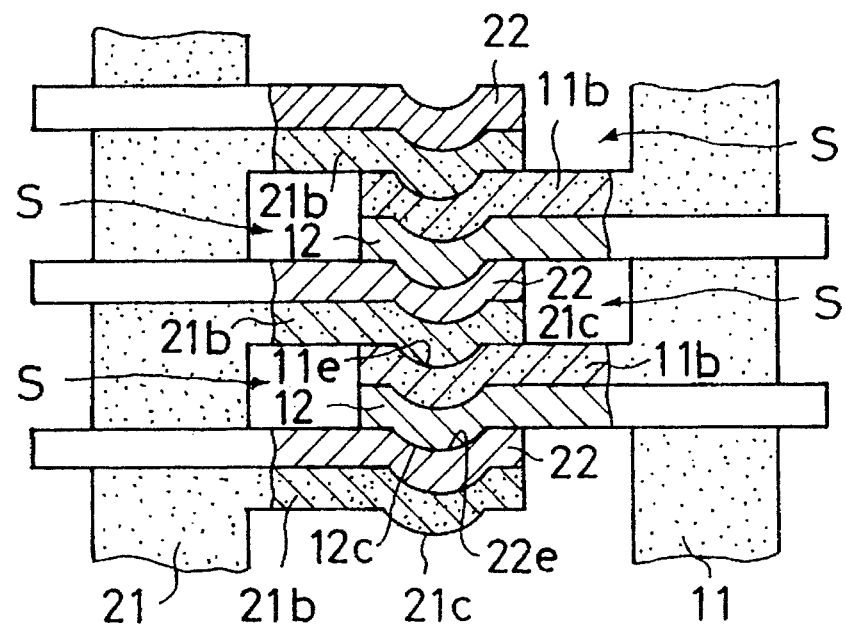
FIG. 7 is a fragmentary cross-sectional view of the connector in closed condition; and, FIG. 8 is a plan view of a second embodiment of the invention

It will be evident that, when extended ends of the band portions of respective carrier strips are threaded into the opposite sides of the flared mouth 32a of conventional zipper fastening implement 32, shown also in FIG. 6A and 6B and the fastener is slid therealong, the connector first and second connector members will be forced together as they enter the mouth as shown in FIG. 5 so that respective contact elements and insulating elements of the first connector member are progressively brought into interlocking, interdigitating relation with respective contact elements of the second connector member thereby electrically to connect complementary contact faces of respective interlocked contact elements together with the insulating elements interposed therebetween, as shown in FIG. 7.

It will be appreciated that the connector members can be separated by reverse movement of the zipper implement 32 which includes the usual separating bar located medially of the mouth as indicated schematically in broken lines in FIG. 6A.

The manufacturing steps for the electrical connector will now be described with particular reference to FIGS. 2A–4A.

A stamping operation is firstly performed on a flat metal strip P, providing a planar strip of contact element precursors 12 which extend side by side, spaced apart at predetermined equal intervals, transversely from an integral carrier strip 13. Each contact element precursor comprises a rectangular, tab-like body portion 12b extending in coplanar relation with, and transversely from, a free end of a foot of a rearward extending, L-shaped lead portion precursor 12a, which functions as a linking portion having an opposite end joined to the carrier strip from which it extends transversely. This provides a contact portion at a forward end of the body portion remote from the lead portion precursor 12a, with a contact surface formed with an upwardly protruding contact pimple or convex protuberance 12c and an oppositely facing surface formed with a complementary concavity or dimple 12e (see FIG. 3B). The free end of the foot of the linking portion joins the rectangular substantially at a longitudinal center line of the body and the body is cut away or rebated at adjacent locations.

As shown in FIG. 2B, each contact element is then bent at a location adjacent the free end of the foot, through 90 degrees so that each tab-like body portion 12b extends perpendicularly, above and below, the linking portion 12a, thereby providing a contact portion at one end of the body portion 12b with a contact surface with the contact pimple 12b facing in one direction longitudinally of the strip and an oppositely facing surface with the dimple 12e, and a lead portion 12a, extending rearward of another end of the body. This also locates rear corners 12f and 12g of the body portion respectively above and below the lead or linking portion 12a, as shown in FIG. 6B providing guiding shoulders for passage through the fastening implement, as described below.

As shown in FIGS. 3A and 3B, a second strip of contact elements is also provided, and is similar to the first except that linking portions 12a' are of increased length and are stepped upward at locations spaced from the body portions 12b' by a distance corresponding substantially to the lengths of the lead portions 12a to permit precise alignment in a mold of the contact elements of one strip with those of the other strip as described below.

The respective strips of contact elements are supported in a mold with the respective carrier strips 13 and 13', respectively, located one above the other and with the lower carrier strip 13' spaced rearward of the upper carrier strip 13 so that contact elements 12 of one strip are longitudinally aligned with and alternate with the respective contact elements 12' of the other strip to form a single row of coplanar contact elements extending in side by side relation, spaced apart at predetermined, equal, intervals reduced to one half those of a single strip.

Silicon rubber or other suitable elastic or resilient melt is poured or injected into the mold to extend between and substantially envelope respective body portions of respective contact elements at locations remote from the contact portions and the base portions of respective linking or lead portions 12a, 12a', and to cover respective oppositely facing surfaces in insulating relation therewith, as shown in FIGS. 3B and 6B. Furthermore, the concavities 11e, 11e' are formed in the insulating layers forming insulating elements 11b, 11b' to conform with the profiles of the concavities 12e, 12e' which are formed in the oppositely facing surfaces of the respective contact portions. Thus, both the contact portions of the contact elements and the insulating elements are spaced apart at equal intervals.

As shown in FIG. 3B, as a result of the insert molding process described above, gaps S of width W are formed between the contact surface of one contact portion (12b or 12b') and the insulating element 11b on the oppositely facing surface of the body portion of an adjacent contact element. The widths W of the gaps are somewhat smaller than the total combined thickness t of a contact portion 12b or 12b' and the insulating element 11b attached thereto.

The lead or linking portions 12a and 12a', are then severed along the broken line C to provide lead portions 12a and 12a' of constant length.

The complementary mating connector member 2 is made in a similar complementary fashion so that, as shown in FIG. 1, the contact surfaces of the respective contact elements 12 face in a direction opposed to the contact surfaces of the respective contact elements 22 for electrically connecting engagement therewith and are formed with respective dimples or concavities 22e for receiving the respective pimples 12c of the first connector member, and the respective insulating elements 21b are formed with pimples 21c firmly attached to the non-contacting surface having a pimple.

As shown in FIG. 1, installation of a connector member 1 or 2, is carried out by gang soldering all lead portions 12a and 12a', or 22a of the respective contact elements 12 or 22 as a single groups to respective circuit paths PT or PT' on flexible printed circuit boards FPC or FPC'. As a result of the increased/doubled pitch, a close or fine pitch density can be obtained with a desirable corresponding increase in density of the conductive paths on the circuit board. Slits SL and SL' are formed into edge portions of respective circuit boards at locations between adjacent conductive paths which permit smooth deformation of the insulating carrier strip 11 and 21 of the first and second contact members.

To interconnect or mate the first and second connector members, an extended end of the band portion of the second insulating carrier strip 21 of the connector 2 is threaded through the mouth 32a and outlet 32b of the zipper opening and closing implement 32 and the positioning stop member 31 is installed thereon. The corresponding end of the band of the first insulating carrier strip 11 of the first connector member 1 is similarly threaded through the fastening implement 32 and inserted into the positioning stop member 31 to align the respective contact elements 12 and 22 of the first and second connector members 1 and 2 with the gaps S of the second and first connector members, respectively.

The fastening implement 32 is then slid along the two connector members 1, 2 by pulling the handle 32c.

As shown in FIGS. 6A and 6B during receipt of the rear of the tab-like body portion 12b of the contact element 12 inside fastening implement 32, the lead part 12a passes through the slit 32d formed in the side surface of the fastening implement 32 and remains connected to the flexible circuit board, while the fastening implement 32 is guided by engagement with the upper and lower shoulders 12f and 12g of the engaging part 12b progressively camming or channeling successive engaging parts 12b inwardly from the inner surface 32d of the fastening implement 32 into successively aligned gaps of the other connector, enabling the fastening implement 32 to be slid smoothly along the connector members while bringing the respective contact elements and insulating elements into intermeshing or interdigitating engagement.

More specifically, during the sliding movement to the closed condition, the respective contact elements 12 and 22 of the first and second connector members 1 and 2 together with their attached insulating elements 11b and 21b, as shown in FIG. 7, are successively and alternately pushed into the successively aligned gaps S of the other connector member sliding the respective contact surfaces of respective contact elements 12 and 22 into engagement with mating of the respective contact pimples and dimples in a snap action interlocking the engaging contact elements firmly together. At the same time, the respective insulating elements 11b and 21b of the connector members 1 and 2, respectively, are compressed into engagement with intermating of their respective indents and detents 11e and 21c, respectively providing a firm linkage. The pairs of engaging contact elements are reliably insulated from each other. Moreover, the elasticity or resiliency of the insulating material particularly the elements 11b and 21b which have been compressed by the assembly provides a strong biassing force from all directions restoring the engaging contact elements 12, 22 into full engagement and producing a high contact pressure between the contact elements 12 and 22 and a reliable electrical connection.

Furthermore, as a result of the elasticity or resiliency of the insulating carrier strips, even if the printed boards FPC, FPC' are twisted or folded over, the mated connector members will follow the deformation without loss of connection while, even if external forces are applied to twist the contact elements 12, 22 with respect to the insulating carrier strip 11 or 21, they will be urged back to their original positions by these elastic or resiling forces enabling reliable connection to be maintained.

Figure 8:
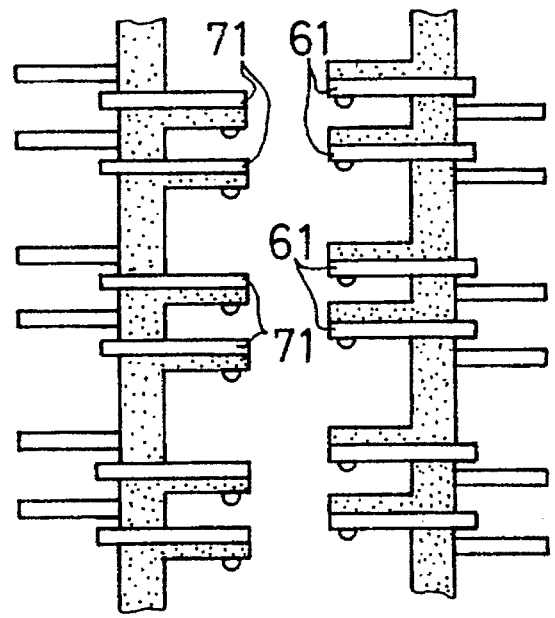

In a second embodiment, shown in FIG. 8, the intervals between the contact elements 61 and 71, are not equal, as in the first embodiment, but differ, as shown, enabling regulation of the the contact pressure between the contact elements 61 and 71.

Thus in both embodiments is enables the contact elements can be assembled in a stable position at constant pitch in a very simple manner by locating them at constant pitch in a mold and pouring or injecting the molten carrier material around them. In addition, as the connector member is completely assembled independently of the flexible printed board prior to installation, it can be handled independently as a single part and installed on the circuit board by essentially only a single operation.

Furthermore, the resiliency or elasticity of the carrier strip will provide a biassing action maintaining or returning the individual contact member in their correct fully connected positions, preventing dislodgement and disconnection by an externally applied force while also providing a desirably high contact pressure between engaging contact portions. At the same time, such elasticity or resiliency enables controlled flexure of the respective connector members in response to the complex forces produced by the opening and closing implement which ensures a smooth zipper action during connection and disconnection.

We claim:

1. An electrical connector of a zipper type comprising first and second elongate connector members each comprising a series of contact elements mounted spaced apart at predetermined intervals in a row on a carrier strip made of flexible insulating material with respective contact portions of the respective contact elements extending transversely, in a common direction from the carrier strip, and at least one series of insulating elements mounted on the carrier strip of at least the first connector member in alternating relation to the contact elements thereof so that respective contact elements and insulating elements of the first connector member can interlock in interdigitating relation with respective contact elements of the second connector member thereby electrically to connect complementary contact faces of respective interlocked contact elements together with the insulating elements interposed therebetween, the improvement residing in that the carrier strip is made of resilient material in which the individual contact elements are in-mold and in that the contact elements have respective lead forming portions extending transversely from the carrier strip in a direction opposite to the common direction.

2. An electrical connector according to claim 1 wherein the respective contact portions have respective contact surfaces facing in one direction longitudinally of the carrier strip and respective, oppositely facing surfaces to which at least some of the insulating elements are attached in insulating relation.

3. An electrical connector according to claim 2 wherein the insulating elements are molded integrally with the carrier strip.

4. An electrical connector according to claim 1 wherein each contact element is stamped and formed in one piece of sheet metal and comprises a tab-like body portion extending transversely from a free end of a foot of a rearward extending, L-shaped lead forming portion, and perpendicularly, above and below the lead portion, thereby providing the contact portion at a forward end of the body portion remote from the lead forming portion with a contact surface facing in one direction longitudinally of the strip and an oppositely facing surface; the resilient insulating material extending between and substantially enveloping respective body portions of respective contact elements at locations remote from the contact portions and where bent and extending along respective oppositely facing surfaces in insulating therewith.

5. A method for manufacturing an elongate electrical connector member for an electrical connector of a zipper type comprising the steps of:

providing two strips of contact elements each stamped and formed from a single piece of sheet metal stock to extend in side by side relation, spaced apart at predetermined intervals, transversely from respective integral carrier strips;

supporting the respective strips of contact elements positioned in a mold with the respective contact elements of one strip alternating with the respective contact elements of another strip to form a single row of contact elements extending in side by side relation, spaced apart at predetermined, reduced intervals;

injecting resilient insulating material into the mold to form a carrier strip in which respective contact elements are embedded;

removing respective metal carrier strips by severing from respective contact elements, thereby to provide an elongate electrical connector member in which respective contact elements are retained by the carrier strip in the single row extending in side by side relation, spaced apart at substantially the predetermined, reduced intervals and in a common transverse direction from the resilient carrier strip.

6. A method according to claim 5 including the steps of stamping contact element precursors of each metal strip as a blank comprising a tab-like body portion extending in transverse, coplanar relation from a free end of a foot of an L-shaped linking portion which has an opposite end joined to extend transversely from the metal carrier strip;

bending each contact element precursor at a location adjacent the free end of the foot through 90 degrees so that each tab-like body portion extends perpendicularly, above and below, the linking portion, thereby providing a contact portion at one end of the body portion with a contact surface facing in one direction longitudinally of the strip and an oppositely facing surface, and a lead portion extending rearward of another end of the body; and, injecting the resilient insulating material to extend between and substantially envelope respective body portions of respective contact elements at locations remote from the contact portions and where bent and to extend along respective oppositely facing surfaces in insulating relation therewith.

7. An electrical connector of a zipper type comprising first and second elongate connector members each comprising a series of contact elements and a series of insulating elements mounted in alternating, spaced apart relation, at predetermined intervals in a row on a carrier strip made of flexible insulating material with respective contact portions of the respective contact elements and respective insulating elements extending transversely, in a common direction from the carrier strip, respective contact portions having respective contact surfaces facing in one direction longitudinally of the carrier strip and respective, oppositely facing surfaces so that respective contact elements and insulating elements of the first connector member can interlock in interdigitating relation with respective contact elements and insulating elements of the second connector member thereby electrically to connect complementary contact surfaces of respective interlocked contact elements together with the insulating elements interposed therebetween, the improvement residing in that the carrier strip is made of resilient material in which the individual contact elements are in-molded and with the insulating elements integrally formed with the carrier strip to extend therefrom attached in covering insulating relation to respective oppositely facing surfaces of insulating elements and with the contact elements having respective lead forming portions extending transversely from the carrier strip in a direction opposite to the common direction.

8. An electrical connector according to claim 7 wherein each contact element is stamped and formed in one piece of sheet metal and the contact portion comprises a tab-like body portion extending from an end of the lead portion, and perpendicularly, above and below the lead portion, opposite faces of the body portion providing the contact and oppositely facing surface respectively; the resilient insulating material extending between and substantially enveloping respective body portions of respective contact elements at locations remote from the contact portions.

* * * * *